United States Patent
Lai et al.

(10) Patent No.: US 10,290,710 B2
(45) Date of Patent: May 14, 2019

(54) SEMICONDUCTOR DEVICE AND METHOD FOR FORMING THE SAME

(71) Applicant: UNITED MICROELECTRONICS CORP., Hsin-Chu (TW)

(72) Inventors: Kuo-Chih Lai, Tainan (TW); Ming-Chang Lu, Changhua County (TW); Wei Chen, Tainan (TW); Hui-Lin Wang, Taipei (TW); Yi-Ting Liao, Kaohsiung (TW); Chin-Fu Lin, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/696,167

(22) Filed: Sep. 5, 2017

(65) Prior Publication Data

US 2019/0074357 A1 Mar. 7, 2019

(51) Int. Cl.
| | |
|---|---|
| *H01L 29/10* | (2006.01) |
| *H01L 21/385* | (2006.01) |
| *H01L 29/24* | (2006.01) |
| *H01L 29/51* | (2006.01) |
| *H01L 29/66* | (2006.01) |
| *H01L 29/786* | (2006.01) |

(52) U.S. Cl.
CPC ........ *H01L 29/1054* (2013.01); *H01L 21/385* (2013.01); *H01L 29/24* (2013.01); *H01L 29/513* (2013.01); *H01L 29/66969* (2013.01); *H01L 29/517* (2013.01); *H01L 29/7869* (2013.01); *H01L 29/78696* (2013.01)

(58) Field of Classification Search
CPC .......... H01L 29/1054; H01L 29/78696; H01L 29/511; H01L 29/513; H01L 29/24; H01L 27/14616; H01L 27/14609; H01L 27/1225; H01L 21/385; H01L 21/0251; H01L 21/02565
See application file for complete search history.

(56) References Cited

U.S. PATENT DOCUMENTS

| 8,368,067 B2 | 2/2013 | Uchiyama et al. |
| 2008/0038882 A1 | 2/2008 | Takechi et al. |
| 2012/0175609 A1* | 7/2012 | Yamazaki ........... H01L 29/7869 257/43 |
| 2014/0264320 A1 | 9/2014 | Liang et al. |

(Continued)

OTHER PUBLICATIONS

Lai, Kuo-Chih et al., "Gradient deposition for OS (oxide semiconductor) process", Invention Disclosure, Dec. 12, 2016, p. 1-13.

*Primary Examiner* — David C Spalla
(74) *Attorney, Agent, or Firm* — Winston Hsu

(57) ABSTRACT

A semiconductor device and a method of forming the same, the semiconductor device includes a substrate, a first gradient layer, two source/drain structures, a second gradient layer, and a gate. The first gradient layer is disposed on the substrate. The two source/drain structures are separately disposed on the first gradient layer. The second gradient layer is disposed on the two source/drain structures and the first gradient layer, and a second portion of the second gradient layer directly contacts a first portion of the first gradient layer. The gate is disposed on the second gradient layer, between the two source/drain structures.

19 Claims, 4 Drawing Sheets

(56) References Cited

U.S. PATENT DOCUMENTS

2015/0380450 A1* 12/2015 Okamoto .......... H01L 27/14603
257/43
2016/0079439 A1* 3/2016 Yamazaki ........... H01L 29/4908
257/43

* cited by examiner

SEMICONDUCTOR DEVICE AND METHOD FOR FORMING THE SAME

BACKGROUND OF THE INVENTION

1. Field of the Invention

The present invention relates to a semiconductor device and a method for forming the same, and more particularly, to a semiconductor device having a gradient oxide semiconductor layer and a method for forming the same.

2. Description of the Prior Art

In the modern society, the micro-processor systems comprising integrated circuits (IC) are ubiquitous devices, being utilized in diverse fields such as automatic control electronics, mobile communication devices and personal computers. With the development of technology and the increase of original applications for electronical products, the IC devices are becoming smaller, more delicate and more diversified.

In a wide variety of materials, indium oxide ($In_2O_3$), tin oxide ($SnO_2$) and zinc oxide (ZnO) are generally known transparent conductive oxide. Indium tin oxide is (ITO), when being formed of a thin film, can be used as a transparent electrode in a flat panel display or a touch sensor of a capacitance type touch panel. Tin oxide and zinc oxide can be used in a transparent solar cell electrode. However, these materials are essentially semiconductor material, and it is desired for the researchers to develop a semiconductor device by using their semiconductor material property, such as an oxide semiconductor transistor.

However, due to oxidation of the semiconductor material itself, when using of this oxide semiconductor material, it is easy to damage the oxide semiconductor layer during the production process, thus affecting the performance of the product. Therefore, for a semiconductor device having an oxide semiconductor material, there is still a need for a better design or a manufacturing method, thereto gain better quality.

SUMMARY OF THE INVENTION

The present invention therefore provides a semiconductor device, in which two oxide semiconductor layers with gradient oxide concentrations are disposed, with a portion thereof between two source/drain structures to function like a channel region. That is, a better product performance is therefore gained by a simplified structure.

The present invention therefore provides a method of forming a semiconductor device, including forming two oxide semiconductor layers with gradient oxide concentrations are disposed to function like a channel region, so that, a simplified structure may be obtained to achieve better product performance.

In achieving one object, one embodiment of the present invention provides a semiconductor device including a substrate, a first gradient layer, two source/drain structures, a second gradient layer, and a gate. The first gradient layer is disposed on the substrate. The two source/drain structures are separately disposed on the first gradient layer. The second gradient layer is disposed on the two source/drain structures and the first gradient layer, and a second portion of the second gradient layer directly contacts a first portion of the first gradient layer. The gate is disposed on the second gradient layer, between the two source/drain structures.

In achieving one object, one embodiment of the present invention provides a method for forming a semiconductor device including following steps. First of all, a substrate is provided, and a first gradient layer is formed on the substrate. Then, two source/drain structures spaced from each other are formed on the first gradient layer. Next, a second gradient layer is formed to cover on the two source/drain structures and the first gradient layer, with a second portion of the second gradient layer directly contacting a first portion of the first gradient layer. Finally, a gate is formed on the second gradient layer, between the two source/drain structures.

Overall speaking, the semiconductor device of the present invention includes two gradient layers with oxygen concentration gradient, and the two gradient layers are respectively formed below the source/drain structures and over the source/drain structures. The oxygen content ratio within gradient layer below the source/drain structures is preferably decreased from bottom to top, and the oxygen content ratio within gradient layer over the source/drain structures is preferably increased from bottom to top. That is, two portions of the gradient layers which are in contact with each other, between the source/drain structures, may therefore both obtain the lower oxygen content ration, so as to together form a channel region of the semiconductor device. In this way, the semiconductor device of the present invention is able to achieve better product performance in the simplified structure, via a simplified and convenient process.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 5 are schematic diagrams illustrating a method of forming a semiconductor device according to a first embodiment of the present invention, in which:

FIG. 1 shows a cross-sectional view of a semiconductor device after forming a gradient layer;

FIG. 2 shows a cross-sectional view of a semiconductor device after forming source/drain structures;

FIG. 3 shows a cross-sectional view of a semiconductor device after forming another gradient layer;

FIG. 4 shows a cross-sectional view of a semiconductor device after forming a dielectric layer; and FIG. 5 shows a cross-sectional view of a semiconductor device after forming a gate.

DETAILED DESCRIPTION

To provide a better understanding of the presented invention, preferred embodiments will be described in detail. The preferred embodiments of the present invention are illustrated in the accompanying drawings with numbered elements.

Figure 1:
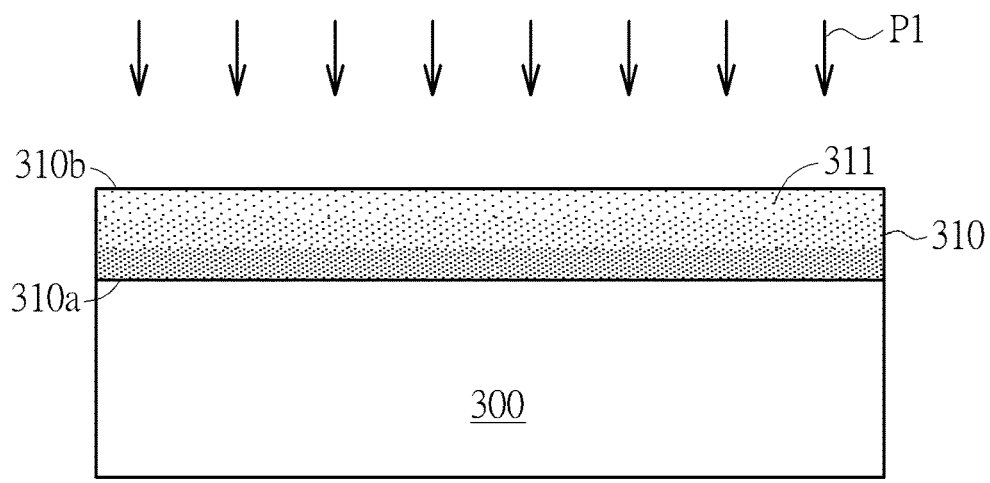

Please refer to FIGS. 1-5, showing a method of forming a semiconductor device according to the first embodiment of the present invention. Firstly, a substrate 300 is provided, and the substrate 300 may be any component that can serve as a base for the forming devices, such as a semiconductor substrate like a silicon substrate, an epitaxial silicon substrate or a silicon on insulator (SOI) substrate. Then, a gradient layer 310 is formed on the substrate 300. In one embodiment, the gradient layer 310 for example includes zinc oxide (ZnO), indium gallium zinc oxide (IGZO), zinc tin oxide (ZTO), or zinc indium oxide (ZIO), and the formation of the gradient layer 310 may be accomplished by performing a deposition process P1, with the oxygen content ratio thereof being changed upon the depositing P1. For example, an oxygen concentration gradient is formed between two opposite surfaces 310a, 310b of the gradient layer 310, with the surface 310a of the gradient layer 310 which directly contacts the substrate 300 preferably including a greater number of oxygen 311, the surface 310b which does not contact the substrate 300 preferably including a less number of oxygen 311, and the oxygen content ratio thereof being uniformly decreased from 70%-100% to 5-20% between the two surfaces 310a, 310b, as shown in FIG. 1. That is, the surface 310a of the gradient layer 310 may therefore function like an insulator, and the surface 310b may therefore function like a channel.

It is noted that the oxygen concentration gradient of the gradient layer 310, as well as the forming process thereof, are not limited to be arranged thereto, and which may be further adjustable accordingly to practical requirements of products. For example, in another embodiment, the gradient layer 310 may also be formed by firstly forming a dielectric layer (not shown in the drawings) and in situ implanting a dopant such as zinc (Zn), gallium (Ga), indium (In), tin (Sn) or a combination thereof into the dielectric layer in a gradient arrangement. Otherwise, in another embodiment, the gradient layer 310 may be formed by performing another deposition process (not shown in the drawings), with the metal content ratio (such as Zn, Ga, In, Sn or a combination thereof) thereof being changed upon the depositing process. Furthermore, in another embodiment, the oxygen concentration gradient of the gradient layer 310 may also be performed in a geometric progression manner or in an arithmetic progression manner, or the oxygen concentration gradient of the gradient layer 310 may be formed from a thickness of 1-5 nm from the surface 310a (while the entire thickness being about 20-30 nm), but is not limited thereto.

Figure 2:
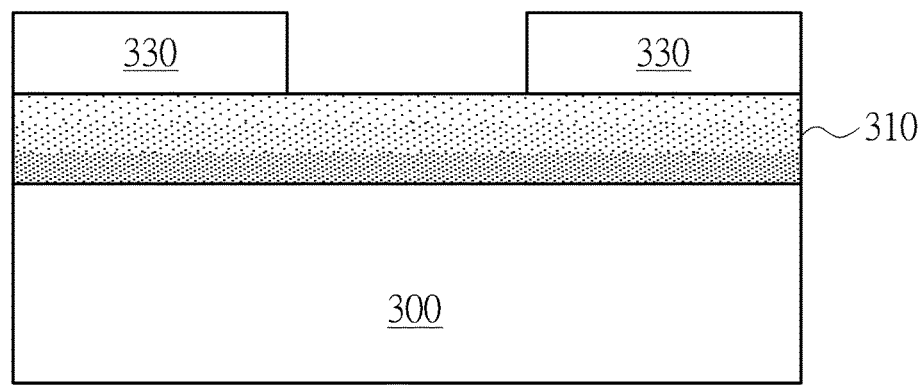

Next, two source/drain structures 330 are formed on the surface 310b of the gradient layer 310. In one embodiment, the source/drain structures 330 are formed by firstly forming a conductive material layer (not shown in the drawings), such as including a low-resistant metal like aluminum (Al), tungsten (W) or copper (Cu), to entirely cover the surface 310b, followed by patterning the conductive material layer, to form two separated source/drain structures 330, and to exposed a portion of the gradient layer 310, as shown in FIG. 2.

Figure 3:
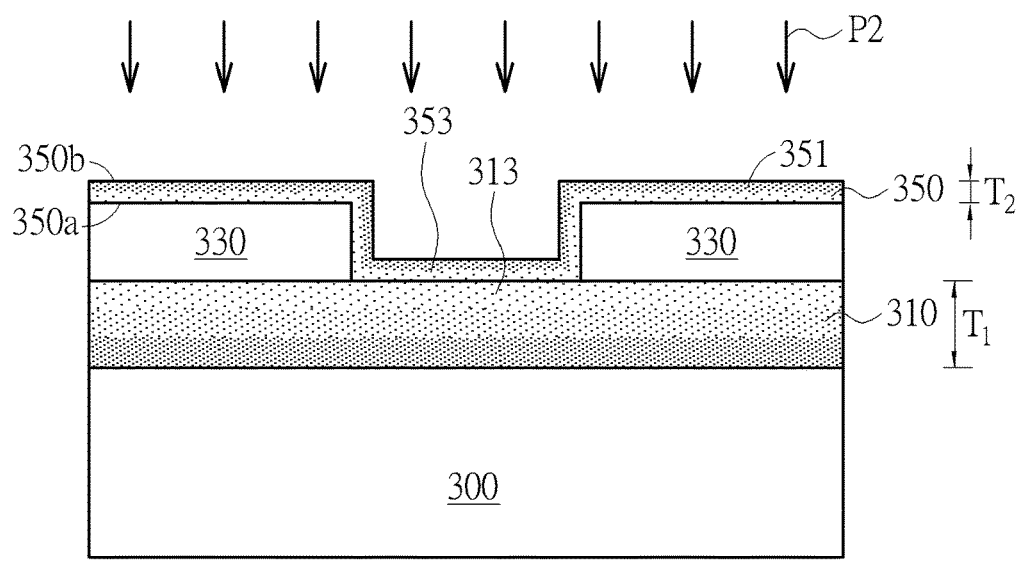

Then, as shown in FIG. 3, another gradient layer 350 is formed conformally on the substrate 300, to cover on the two source/drain structures 330 and the exposed portion of the gradient layer 310. In the present embodiment, the formation of the gradient layer 350 may also be accomplished by performing another deposition process P2, with the oxygen content ratio thereof being changed upon the depositing P2. For example, an oxygen concentration gradient is formed between two opposite surfaces 350a, 350b of the gradient layer 350, with the surface 350a of the gradient layer 350 which directly contacts the source/drain structures 330 and the gradient layer 310 preferably including a less number of oxygen 351, the surface 350b which does not contact the source/drain structures 330 and the exposed gradient layer 310 preferably including a greater number of oxygen 311, and the oxygen content ratio thereof being uniformly increased from 5-20% to 70%-100% between the two surfaces 350a, 350b, as shown in FIG. 3. That is, the surface 350a of the gradient layer 350 may therefore function like a channel, and the surface 350b may therefore function like an insulator.

It is noted that the oxygen concentration gradient of the gradient layer 350, as well as the forming process thereof, are not limited to be arranged thereto, and which may be further adjustable accordingly to practical requirements of products. For example, in another embodiment, the gradient layer 350 may also be formed by firstly forming another dielectric layer (not shown in the drawings) and in situ implanting a dopant such as Zn, Ga, In, Sn or a combination thereof into the dielectric layer in a gradient arrangement. Also, in another embodiment, the oxygen concentration gradient of the gradient layer 350 may be performed in a geometric progression manner or in an arithmetic progression manner, or the oxygen concentration gradient of the gradient layer 350 may be formed from a thickness of 1-3 nm from the surface 350a (while the entire thickness being about 5-10 nm), but is not limited thereto. Additionally, in the present embodiment, a portion 353 of the gradient layer 350 and a portion 313 of the gradient layer 310 which are directly in contact with each other, preferably include the same oxygen concentration.

It is also noted that, the two gradient layers 310, 350 preferably include different oxide semiconductor materials, and different oxygen concentration gradients. For example, in the present embodiment, the gradient layer 350 may include IGZO and the oxygen content ratio thereof is uniformly increased from the surface 350a to the surface 350b, and the gradient layer 310 may include ZnO and the oxygen content ratio thereof is decreased from the surface 310a to the surface 310b in a geometric progression manner or an arithmetic progression manner, but is not limited thereto. In another embodiment, the two gradient layers 310, 350 may also include the same oxide semiconductor material with different oxygen concentration gradients, or different oxide semiconductor materials with the same oxygen concentration gradient, or the same oxide semiconductor material with the same concentration gradient. Furthermore, in the present embodiment, the two gradient layers 310, 350 are preferably in different thickness T1, T2, for example, with the thickness T1 of the gradient layer 310 being about 2-3 times greater than the thickness T2 of the gradient layer 350 as shown in FIG. 3, but is not limited thereto. In another embodiment, the two gradient layers may also include the same thickness (not shown in the drawings).

Figure 4:
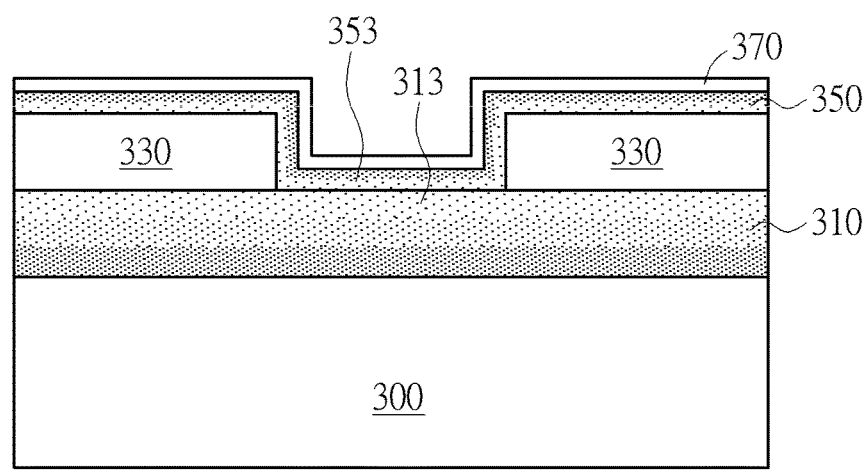
Figure 5:
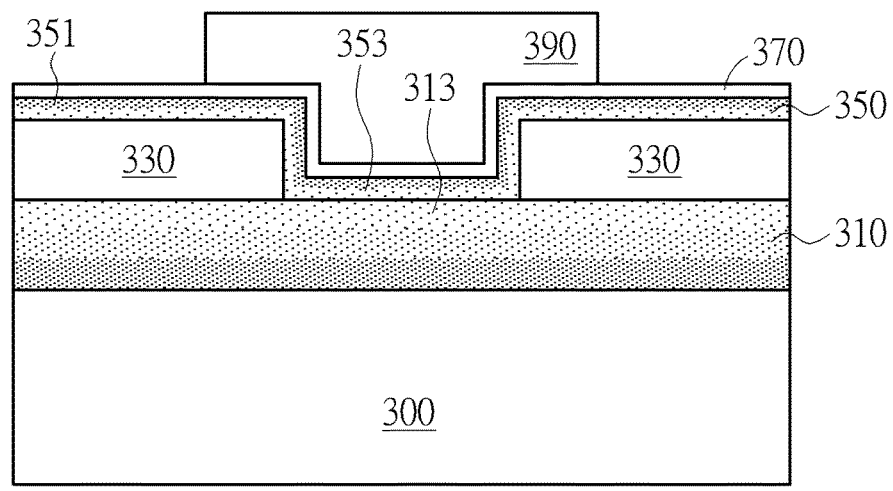

Following these, an isolating layer 370 and a gate 390 are sequentially formed on the substrate 300, as shown in FIG. 5. Precisely, the isolating layer 370 is formed conformally on the gradient layer 350 as shown in FIG. 4, with the isolating layer 370 for example including a high-k dielectric material, such as hafnium oxide ($HfO_2$), hafnium silicon oxide ($HfSiO_4$) or hafnium silicon oxynitride (HfSiON), followed by forming a conductive layer (not shown in the drawings) such as including a low-resistant metal like Cu, W or Al on the isolating layer 370 and patterning the conductive layer to form the gate 390. That is, a portion of the gate 390 may dispose between the two source/drain structures 330, in a horizontal direction (not shown in the drawings).

Through the above-mentioned steps, the method of forming the semiconductor device according to the first embodiment of the present invention is accomplished. In the present invention, two gradient layers 310, 350 are formed respectively, to include the same or different oxygen concentration gradients, and/or the same or different thicknesses. The gradient layer 310 is formed below the source/drain structures 330, and the oxygen content ratio is higher at the interface (namely the surface 310a) between the substrate 300 and the gradient layer 310, and the oxygen content ratio is lower at the interface (namely the surface 310b) between the source/drain structures 330 and the gradient layer 310. On the other hands, gradient layer 350 is formed over the source/drain structures 330, and the oxygen content ratio is higher at the interface (namely the surface 350b) between the isolating layer 370 and the gradient layer 350, and the oxygen content ratio is lower at the interface (namely the surface 350a) between the source/drain structures 330 and the gradient layer 350. It is noted that, the oxygen content ratio of the two gradient layers 310, 350 between the two source/drain structures 330 is firstly changed from about 70%-100% to 5-20%, and then is further changed from 5-20% to 70%-100%, so that the oxygen content ratio at the two portions 313, 353 of the gradient layers 310, 350 are both in a relative lower oxygen concentration, and the detailed oxygen concentrations at the two portions 353, 313 are preferable the same. That is, the two portions 353, 313, disposed between the two source/drain structures 330 may therefore be together configured as a channel region of the semiconductor device in the present embodiment.

Thus, the semiconductor device obtained from the aforementioned forming method in the present embodiment may therefore gain a simplified structure, with the bottom part of the gradient layer 310 and the upper part of the gradient layer 350 being function like an insulator respectively, to isolate from the substrate 300 and the gate 390, and with the upper part of the gradient layer 310 and the bottom part of the gradient layer 350 being function like a channel, especially for the two portions 353, 313 thereof, to configure as the channel region between the source/drain structures 330, below the gate 390, as shown in FIG. 5. That is, the semiconductor device is able to achieve better product performance in the simplified structure.

To one skilled in the art, it is understood that the semiconductor device of the present invention can also be formed through other method and is not limited to above embodiment. Thus, the following context will show other embodiment of the method for forming a semiconductor device. In simplify the description, the below description only shows the different components or steps while omitting the similar steps or components. Besides, similar components will be given the same reference number in order to make each embodiment clear.

Figure 6:
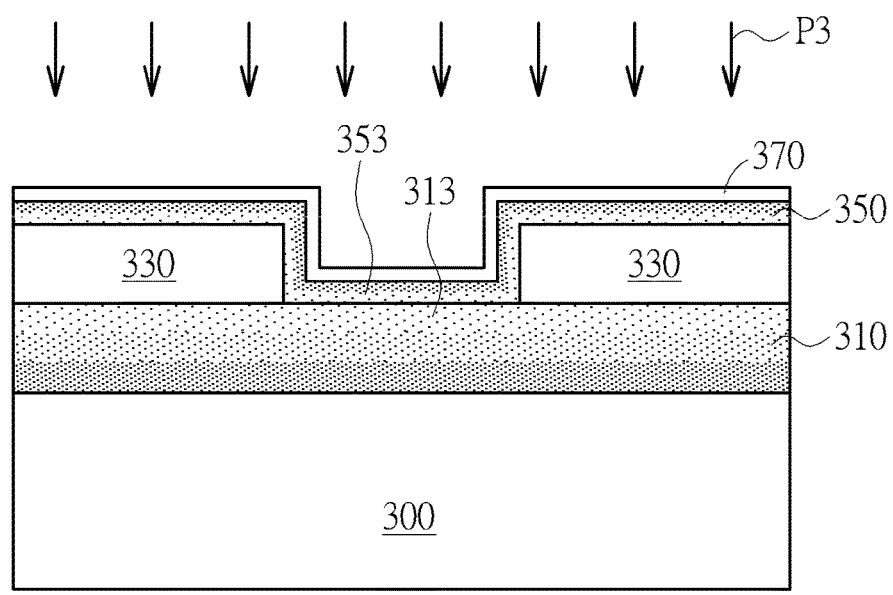
FIG. 6 is a schematic diagram illustrating a method of forming a semiconductor device according to a second embodiment of the present invention.

Please refer to FIG. 6, showing a method of forming a semiconductor device according to the second embodiment of the present invention, wherein the initial steps of this embodiment are similar to the previous first embodiment. The main difference between the present embodiment and the previous first embodiment is in that, the two portions 353, 313 of the two gradient layer 350, 310 respectively may not include the same oxygen concentration, after the depositing processes P1, P2. Then, an annealing process P3 is further performed after forming the insulating layer 370 at the two portions 353, 313, to modify the oxygen concentration at the two portions 353, 313. That is, the two portions 353, 313 of the two gradient layers 350, 310 may therefore obtain the same oxygen concentration after the annealing process P3, and the portions 353, 313 may together form the channel region of the semiconductor device in the subsequent process.

According to the above description, the method of forming the semiconductor device according to the second embodiment of the present invention is accomplished. The semiconductor device obtained from the aforementioned forming method in the present embodiment may also gain a simplified structure to achieve better product performance.

Figure 7:
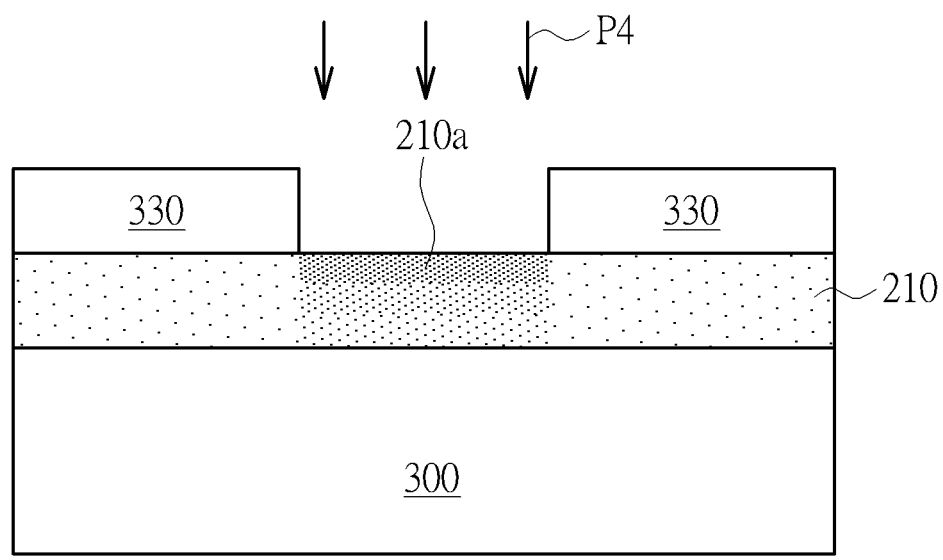
FIG. 7 is a schematic diagram illustrating a method of forming a semiconductor device according to a third embodiment of the present invention.

Please refer to FIG. 7, showing a method of forming a semiconductor device according to the third embodiment of the present invention, wherein the initial steps of this embodiment are similar to the previous first embodiment. The main difference between the present embodiment and the previous first embodiment is in that, the gradient layer below the two source/drain structures 330 is only formed between the two source/drain structures 330. Precisely speaking, in the present embodiment, a material layer 210 for example including an oxide semiconductor material such as ZnO, IGZO, ZTO or ZIO, or including a dielectric material such as oxide, is firstly formed on the substrate 300, and the two separated source/drain structures 330 are then formed on the material layer 210. Then, an implanting process P4 is performed to form a metal (such as Zn, Ga, In, Sn or a combination thereof) concentration gradient only within a middle portion 210a of the material layer 210, between the two source/drain structures 330. That is, the gradient layer of the present embodiment is formed only in the middle portion 210a, as shown in FIG. 7.

It is noted that, although being formed only within the middle portion 210a, the gradient layer of the present embodiment also includes the oxygen concentration gradient between two opposite surfaces, with a surface directly contacting the substrate 300 preferably including a greater number of oxygen (namely, a less number of metal as shown in FIG. 7), another surface not contacting the substrate 300 preferably including a less number of oxygen (namely, a greater number of metal as shown in FIG. 7), and the oxygen content ratio thereof being uniformly decreased from 70%-100% to 5-20% between the two opposite surfaces, as shown in FIG. 7. That is, the surface contacting the substrate 300 may therefore function like an insulator, and the another surface not contacting the substrate 300 may therefore function like a channel.

Following these, the gradient layer 350, the isolating layer, 370 and the gate 390 are sequentially formed through the similar forming steps of the first embodiment as shown in FIGS. 3-5, and will not be further described herein after. According to the above description, the method of forming the semiconductor device according to the third embodiment of the present invention is accomplished. The semiconductor device obtained from the aforementioned forming method in the present invention may also gain a simplified structure to achieve better product performance.

Furthermore, although the forming method of the present invention is exemplified through the aforementioned steps, and the detailed process and conditions thereof may be further adjustable according to the practical requirements of the products. For example, in other embodiments, the annealing process P3 of the second preferred embodiment in the present invention may also be performed right after the depositing process P2 instead of after forming the isolating layer 370, to modify the oxygen concentration at the two portions 353, 313. In another embodiment, the isolating layer 370 and the gradient layer 350 may also be patterned while patterning the gate 390, so that, the patterned isolating layer (not shown in the drawings), the patterned gradient layer 350 (not shown in the drawings) and the gate 390 may therefore obtain a vertical aligned sidewall (not shown in the drawings).

In summary, the present invention provides a semiconductor device, in which two gradient layers with oxygen concentration gradient are respectively formed below the source/drain structures and over the source/drain structures. The oxygen content ratio within gradient layer below the source/drain structures is preferably decreased from bottom to top, and the oxygen content ratio within gradient layer over the source/drain structures is preferably increased from bottom to top. That is, two portions of the gradient layers which are in contact with each other, between the two source/drain structures, may therefore both obtain the lower oxygen content ratio, so as to together form a channel region of the semiconductor device. In this way, the semiconductor device of the present invention is able to achieve better product performance in the simplified structure, via a simplified and convenient forming process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
    a substrate;
    a first gradient layer disposed on the substrate;
    two source/drain structures separately disposed on the first gradient layer, wherein an oxygen concentration of the first gradient layer is decreased from a first surface contacting the substrate to a second surface contacting the two source/drain structures;
    a second gradient layer disposed on the two source/drain structures and the first gradient layer, wherein a second portion of the second gradient layer directly contacts a first portion of the first gradient layer; and
    a gate disposed on the second gradient layer, between the two source/drain structures.

2. The semiconductor device of claim 1, wherein the first portion of the first gradient layer and the second portion of the second gradient layer comprise a same oxygen concentration.

3. The semiconductor device of claim 1, wherein the oxygen concentration of the first portion and the second portion is lower than an oxygen concentration of the first surface of the first gradient layer.

4. The semiconductor device of claim 2, wherein an oxygen concentration of the second gradient layer is increased from a third surface contacting the two source/drain structures to a fourth surface opposite to the third surface.

5. The semiconductor device of claim 4, wherein the oxygen concentration of the first portion and the second portion is lower than an oxygen concentration of the third surface of the second gradient layer.

6. The semiconductor device of claim 1, wherein the first portion of the first gradient layer and the second portion of the second gradient layer are between the two source/drain structures.

7. The semiconductor device of claim 1, wherein the first gradient layer and the second gradient layer comprises a same oxide semiconductor material.

8. The semiconductor device of claim 1, wherein the first gradient layer and the second gradient layer comprises different thicknesses.

9. The semiconductor device of claim 1, wherein the first gradient layer and the second gradient layer comprise different oxygen concentration gradients.

10. The semiconductor device of claim 1, further comprising:
    an isolating layer disposed between the second gradient layer and the gate.

11. A method for forming a semiconductor device, comprising:
    providing a substrate;
    forming a first gradient layer on the substrate,
    forming two source/drain structures spaced from each other, on the first gradient layer, wherein an oxygen concentration of the first gradient layer is decreased from a first surface contacting the substrate to a second surface contacting the two source/drain structures;
    forming a second gradient layer covered on the two source/drain structures and the first gradient layer, wherein a second portion of the second gradient layer directly contacts a first portion of the first gradient layer; and
    forming a gate on the second gradient layer, between the two source/drain structures.

12. The semiconductor device of claim 11, further comprising:
    performing at least one deposition process, to form the first gradient layer and the second gradient layer.

13. The semiconductor device of claim 12, further comprising:
    performing an annealing process after the deposition process, and the first portion and the second portion comprise a same oxygen concentration after performing the annealing process.

14. The semiconductor device of claim 11, further comprising:
    forming an insulating layer between the second gradient layer and the gate.

15. A semiconductor device, comprising:
    a substrate;
    a first gradient layer disposed on the substrate;
    two source/drain structures separately disposed on the first gradient layer;
    a second gradient layer disposed on the two source/drain structures and the first gradient layer, wherein a second portion of the second gradient layer directly contacts a first portion of the first gradient layer, and the first gradient layer and the second gradient layer comprises a same oxide semiconductor material; and
    a gate disposed on the second gradient layer, between the two source/drain structures.

16. The semiconductor device of claim 15, wherein the first portion of the first gradient layer and the second portion of the second gradient layer comprise a same oxygen concentration.

17. The semiconductor device of claim 15, wherein an oxygen concentration of the first gradient layer is decreased from a first surface contacting the substrate to a second surface contacting the two source/drain structures, and an oxygen concentration of the second gradient layer is increased from a third surface contacting the two source/drain structures to a fourth surface opposite to the third surface.

18. The semiconductor device of claim 15, wherein the first portion of the first gradient layer and the second portion of the second gradient layer are between the two source/drain structures.

19. The semiconductor device of claim 15, wherein the first gradient layer and the second gradient layer comprise different oxygen concentration gradients.

* * * * *